United States Patent [19]

Kimata

[11] Patent Number: 4,583,003
[45] Date of Patent: Apr. 15, 1986

[54] SOLID-STATE IMAGE SENSOR

[75] Inventor: Masafumi Kimata, Itami, Japan

[73] Assignee: Mitsubishi Denki Kabushiki Kaisha, Tokyo, Japan

[21] Appl. No.: 644,433

[22] Filed: Aug. 27, 1984

[30] Foreign Application Priority Data

Nov. 30, 1983 [JP] Japan ................................. 58-228029

[51] Int. Cl.$^4$ ............................................. H01J 40/14
[52] U.S. Cl. ......................................... 250/578; 357/32
[58] Field of Search ................... 250/211 J, 578, 209; 358/212, 213; 357/24 LR, 30, 31, 32

[56] References Cited

U.S. PATENT DOCUMENTS

| 4,179,711 | 12/1979 | Nagumo | 358/213 |
| 4,447,735 | 5/1984 | Horii | 250/578 |
| 4,504,848 | 3/1985 | Matsumoto et al. | 357/24 LR |

OTHER PUBLICATIONS

"Visible and Infrared Solid-State Image Sensors", I E D M 83-1, pp. 1-7, by Walter F. Kosonocky, (1983).

Primary Examiner—David C. Nelms
Attorney, Agent, or Firm—Lowe Price LeBlanc Becker & Shur

[57] ABSTRACT

A solid-state image sensor comprises photo sensors (110 to 114, 211 to 214 and 311 to 314), transfer gates (121 to 124, 221 to 224 and 321 to 324), vertical charge transferring elements (130, 230 and 330), interfacing portions (140, 240 and 340), horizontal CCD (500) and a clock signal source (800). Each of the vertical charge transferring elements (130, 230 and 330) has a plurality of gate electrodes under which the respective channels are formed, each with a potential barrier provided for separating the channel from the adjacent channel. A plurality of potential wells separated by said plurality of potential barriers are formed in the vertical charge transferring elements in response to clock signals applied from said clock signal source to said gate electrodes. Transfer of the signal charge provided by the photo sensor to the vertical charge elements is performed by controlling the clock signals applied to the gate electrodes so as to remove the potential well successively toward the moving direction of the charge.

16 Claims, 6 Drawing Figures

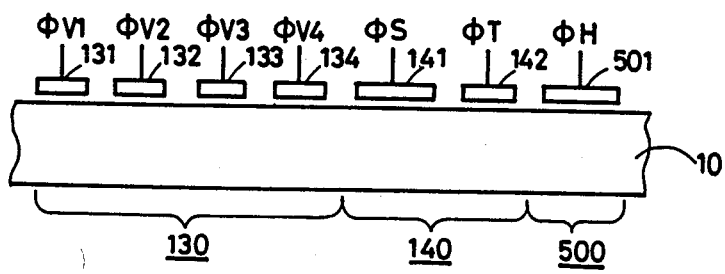
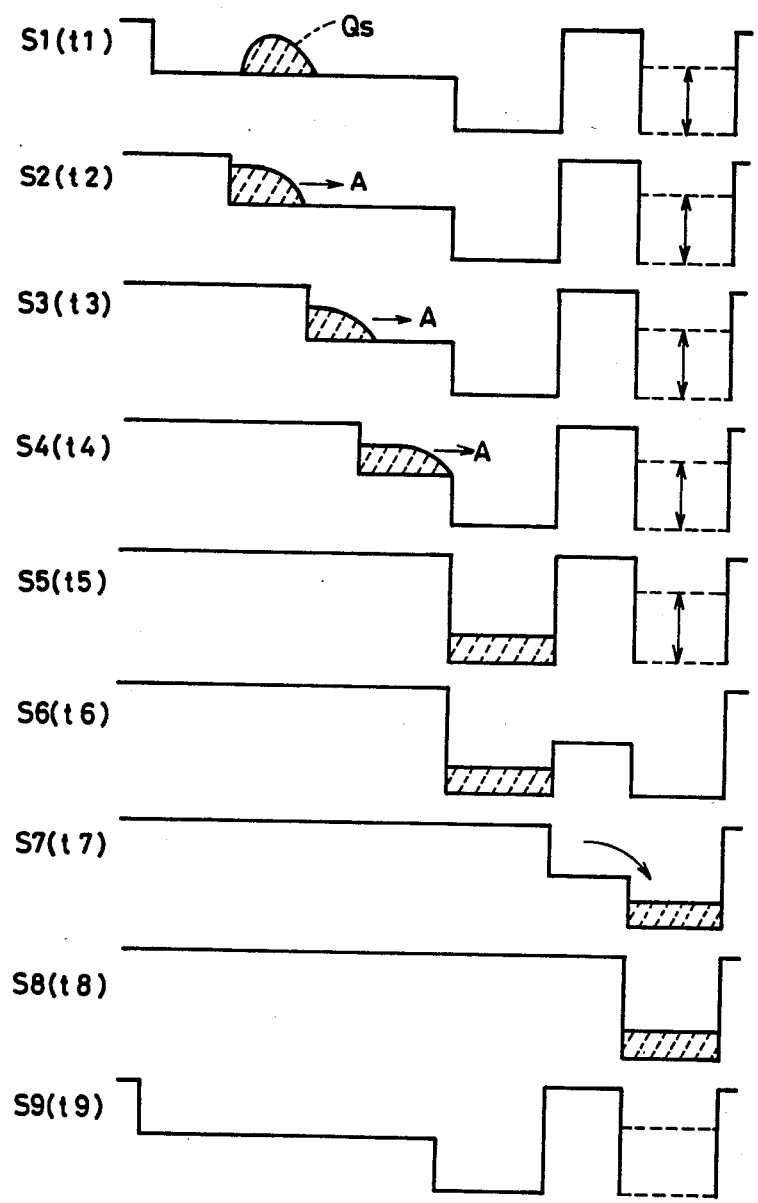

SOLID-STATE IMAGE SENSOR

BACKGROUND OF THE INVENTION

1. Field of the Invention

The present invention relates to a solid-state image sensor, and particularly relates to a two-dimensional solid-state image sensor characterized by the reading of signals.

2. Description of the Prior Art

Generally, a solid-state image sensor comprises photo sensors and a scanning circuit on a semiconductor material such as silicon, and if suitable photo sensors are selected, images from the visible region to an infrared region can be provided. As compared with a conventional image tube, a solid-state image sensor is advantageous in that it is compact, light in weight and has high reliability and in particular, few portions need to be adjusted in manufacturing a camera using such an image sensor. Thus, such a solid-state image sensor has recently attracted attention in various fields.

As a scanning circuit of a solid-state image sensor, a MOS switch system or a CCD (charge coupled device) system is conventionally used in most cases. In the former MOS switch system, spike noise due to the MOS switches used for reading the signals is mixed into the signals, which decreases the signal-to-noise ratio. In addition, the spike noise differs between the columns for reading the signals, which generates a so called fixed pattern noise to further decrease the signal-to-noise ratio, and as a result, a MOS switch system cannot be used for the detection of an extremely low light level application which requires a high signal-to-noise ratio. On the other hand, in the latter CCD system, particularly in a CCD interline system which has been widely used recently because it is capable of freely selecting photo sensors as in a MOS system, CCDs are disposed between the respective columns of photo sensors, and in order to enlarge the effective area of the photo sensors, it is desired to minimize the area of the CCD portion in making a design. In addition, the charge transferring capacity of the CCDs is proportional to the storage gate area for one stage of CCDs if the CCDs have the same structure. Accordingly, if the area of the CCD portion is decreased, the maximum value of the charge to be handled becomes limited. Such a problem becomes serious particularly at the time of detecting a low level signal in a high level background as in an infrared ray solid-state image sensor.

On the other hand, a solid-state image sensor generating less noise and having a high dynamic range has been proposed in which the respective vertical charge transferring elements are driven as a single potential well. For example, such a solid-state image sensor is shown in copending application of the same applicant as the present U.S. application Ser. No. 519,904, filed Aug. 3, 1983 (German application No. P3329095.4, filed Aug. 11, 1984) incorporated herein by reference. FIGS. 1 to 3 are drawings for explaining an operation of one example of such a solid-state image sensor.

FIG. 1 is a block diagram showing an example of the above described solid-state image sensor. An array of 3 columns×4 rows is represented for the purpose of facilitating the explanation. A solid-state image sensor comprises photo sensors 111 to 114, 211 to 214 and 311 to 314 disposed two-dimensionally on a semiconductor substrate, transfer gates 121 to 124, 221 to 224 and 321 to 324 formed of MOS transistors on the semiconductor substrate, vertical charge transferring elements 130, 230 and 330 formed on the semiconductor substrate, interface portions 140, 240 and 340 formed on the semiconductor substrate, which constitute an interface with a horizontal CCD 500, an output preamplifier 600 and an output portion 700. The solid-state image sensor further comprises a clock signal source 800 for applying clock signals, as described subsequently, to the vertical charge transferring elements 130, 230 and 330.

With reference to FIGS. 2A, 2B and 3, a structure and an operation of the portions relating to transfer of charge in a vertical direction, that is, vertical charge transferring elements 130 to 330 and interface portions 140 to 340, will be described in the following. FIG. 2A is a sectional view taken along the line II—II in FIG. 1; FIG. 2B shows the potential states in the portions shown in FIG. 2A; FIG. 3 is a timing chart of clock signals applied to the portions shown in FIG. 2A. The vertical charge transferring element 130 comprises four gate electrodes 131 to 134 and the interface portion 140 comprises two gate electrodes 141 and 142, the end of the interface portion 140 being in contact with a gate electrode 501 in the horizontal CCD 500. The reference numeral 10 denotes a semiconductor substrate. Channels are formed under the respective gate electrodes. These channels may be surface channels or buried channels. FIG. 2A shows a structure in which gaps are provided between the respective electrodes. However, multilayer gate electrodes may be used with overlapped portions between the electrodes. To the gate electrodes 131 to 134, 141 and 142, clock signals $\phi_{V1}$ to $\phi_{V4}$, $\phi_S$ and $\phi_T$ from the clock source 800 are applied respectively as shown in FIG. 3. In this case, n-channels are adopted. In the case of p-channels, the polarity of the clock signals will have to be inverted.

Vertical charge transfer in the portions shown in FIG. 2A will be described referring to FIG. 2B. The potential states S1 to S9 in FIG. 2B correspond respectively to the timings t1 to t9 in FIG. 3. For example, the state S1 is a potential state in the portions shown in FIG. 2A when it corresponds to the timing t1. At this time, the clock signals $\phi_{V1}$ to $\phi_{V4}$ are all at the level "H" and as a result, a large potential well is formed under the gate electrodes 131 to 134, and a deeper potential well is formed under the gate electrode 141 since the clock signal $\phi_S$ is at the level "H" higher than the clock signals $\phi_{V1}$ to $\phi_{V4}$, and a shallow potential barrier is formed under the gate electrode 142 since the clock signal $\phi_T$ is at the level "L". On the other hand, the horizontal CCD 500 performs charge transfer in the above described state and is in a potential state which changes in a reciprocating manner between the limits shown by the dotted lines in FIG. 2B. In such a state, when an arbitrary transfer gate in the vertical direction, for example a transfer gate 121, is turned on to read the content of the photo sensor 111 into the vertical charge transferring element 130, a signal charge $Q_S$ is given to the potential well under the gate electrodes 131 to 134. Then, in the timing t2, when the clock signal $\phi_{V1}$ changes to be at the level "L", the signal charge $Q_S$ is pushed toward the direction of an arrow A in FIG. 2B, since the potential well under the gate electrode 131 becomes shallow as shown in the state S2. Further, in the timings t3 to t5, the clock signals $\phi_{V2}$ to $\phi_{V4}$ are successively brought to the level "L", the potential wells under the gate electrodes 132 to 134 become shallow successively as shown in the states S3 to S5, so that the signal charge $Q_S$ is pushed toward the direction of the arrow A. At the time when the clock signal $\phi_{V4}$ is at the level "L", the signal charge $Q_S$ is stored in the potential well under the gate electrode 141. The gate electrode 141 must be sufficiently large for storing the signal charge $Q_S$, but the potential well under the gate electrode 141 at the time when the clock signal $\phi_S$ is at the level "H" need not be deeper than the potential well under the gate electrodes 131 to 134 as shown in the above described example. Thus, the signal charge $Q_S$ is collected in the gate electrode 141 and after scanning is completed for one horizontal line in the horizontal CCD 500, the clock signal $\phi_H$ of the gate electrode 501 of the horizontal CCD 500 in contact with the gate electrode 142 is brought to the level "H" and the clock signal $\phi_T$ of the gate electrode 142 is brought to the level "H" in the timing t6. Then, the potentials under the respective gate electrodes become to be in the state S6 shown in FIG. 2B. At this time, the potential well under the gate electrode 142 is made shallower than the potential wells under the gate electrodes 141 and 501, but it is not necessarily needed to determine the potentials in such a manner. Next, in the timing t7, the clock signal $\phi_S$ is at the level "L" and the potential well under the gate electrode 141 becomes shallow as shown in the state S7, so that the signal charge $Q_S$ moves into the potential well under the gate electrode 501. After that, in the timing t8, clock signal $\phi_T$ is brought to the level "L" and the potential well under the gate electrode 142 becomes shallow as shown in the state S8, so that the signal charge $Q_S$ is transferred to the horizontal CCD 500. The horizontal CCD 500 which has received the signal charge $Q_S$ operates to transfer signals successively to the output preamplifier 600. After a signal is transferred to the horizontal CCD 500, the clock signals $\phi_{V1}$ to $\phi_{V4}$ and $\phi_S$ attain again the level "H" in the timing t9 and the same state as in the timing t1 is established.

Next, when a clock signal $\phi_{T2}$ reaches the level "H", the transfer gate 122 is turned on to apply the signal of the photo sensor 112 to the vertical charge transferring element 130, so that the signal is transferred to the horizontal CCD 500 in the same operation as described above. Further, the same cycle is repeated so as to read the signals of the photo sensors 113 and 114, and thus one frame is brought to an end.

The above described operation is performed simultaneously in the other columns. Thus, scanning of a two-dimensional array is performed.

In accordance with the above described solid-state image sensor, since signal charge is transferred through the potential well in the same manner as in a conventional CCD system, spike noise as in an MOS system is never produced and the signal charge amount to be handled can be made extremely large since it is determined by the potential well in a whole vertical line of the vertical charge transferring elements 130, 230 and 330. In addition, even if the width of channels for forming a vertical signal line is made small in the vertical charge transferring elements, the signal charge amount to be handled can be made sufficiently large. Furthermore, since the interface portions 140, 240 and 340 and the horizontal CCD 500 can be formed outside the array of the photo sensors 111 to 114, 211 to 214 and 311 to 314, less limitation is made to the sizes thereof and it becomes easy to enlarge the interface portions and the horizontal CCD according to the necessary charge amount. In the above described solid-state image sensor, the vertical charge transferring elements are scanned in one horizontal period (conventionally, vertical charge transferring elements are scanned in a period nearly equivalent to the time of one frame at the maximum) and the time required for the signal charge $Q_S$ to exist in the channel is shortened, and as a result, channel leak current and the smear phenomenon can be reduced.

Meanwhile, a model of transfer of free charge has been considered as a mechanism of transfer of charge in the above described vertical charge transferring elements, which includes three processes, that is, thermal diffusion of charge by heat, self-induced drift and fringing field drift. Of these processes, the self-induced drift and fringing field drift are very important, and, particularly, the self-induced drift is caused, at an earlier time of transfer, by repulsion between the respective carriers. Most of the signal charges are transferred by the self-induced drift. Since carriers are distributed in a widespread manner in a channel under a gate electrode in the above described charge transferring elements, the effect of the above described self-induced drift is quite small and hence sufficient efficiency of transfer can not be obtained.

SUMMARY OF THE INVENTION

Briefly, the present invention is a solid-state image sensor which comprises a plurality of photo detecting means arranged in two dimensions, a plurality of vertical charge transferring means connected to each photo detecting means, horizontal charge transferring means connected to the vertical charge transferring means and clock means, the vertical charge transferring means being provided with a plurality of gate electrodes connected to the clock means, the channels under said gate electrodes being separated from each other by a plurality of potential barriers.

The photo detecting means detects light to generate signal charge. The vertical charge transferring means transfers the signal charge received from the photo detecting means. The horizontal charge transferring means transfers the signal charge from the vertical charge transferring means to the output portion. The clock means provides a clock signal to the gate electrodes provided in the vertical charge transferring means, so that a plurality of potential wells divided by potential barriers may be formed under the gate electrodes. In addition, the clock means controls the gate potential so as to move a potential well successively toward the moving direction of the charge from the opposite gate electrode, so that the signal charge is transferred from the vertical charge transferring means to the horizontal charge transferring means. In accordance with the present invention, the signal charge is transferred, as a lump of charge, in accordance with the capacitance of the well as formed, since the vertical charge transferring means is provided with a plurality of potential wells separated from each other by a plurality of potential barriers.

Therefore, a principal object of the present invention is to provide a solid-state image sensor having a considerably high transfer efficiency of the signal charge.

Principal advantages of the present invention are that spread of charges to be transferred is effectively restricted and hence the effect of self-induced drift is increased and high charge transfer efficiency can be obtained, since the signal charge is transferred as a lump of charge by potential wells separated by potential barriers.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 2A is a sectional view taken along the line II—II in FIG. 1;

FIG. 2B shows potential states in the portions shown in FIG. 2A;

DESCRIPTION OF THE PREFERRED EMBODIMENTS

Figure 1:
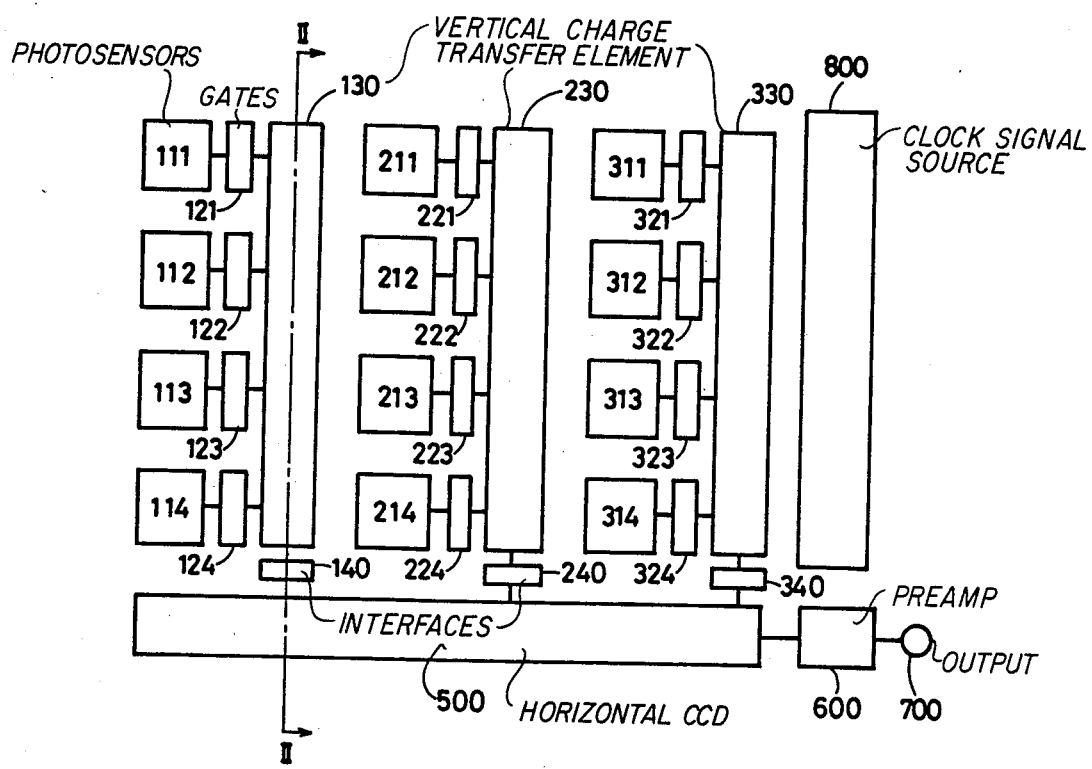
FIG. 1 is a block diagram showing an example of a conventional solid-state image sensor.
Figure 3:
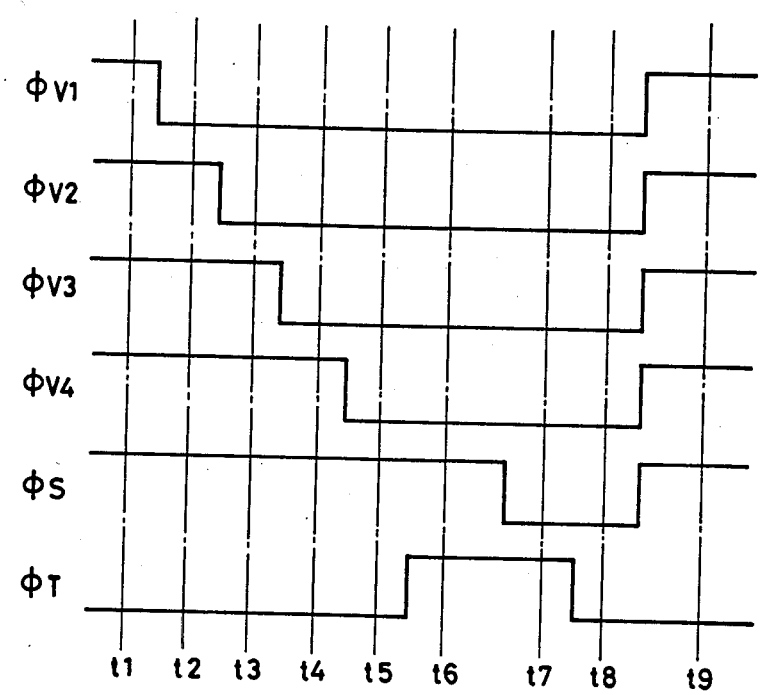
FIG. 3 is a timing chart of clock signals applied to the portions shown in FIG. 2A.
Figure 4A:
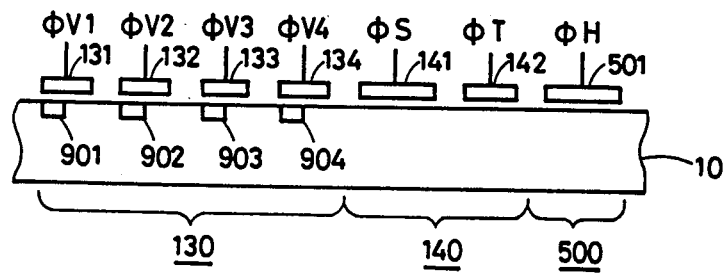
FIG. 4A is a sectional view showing an embodiment of the present invention.
Figure 4B:
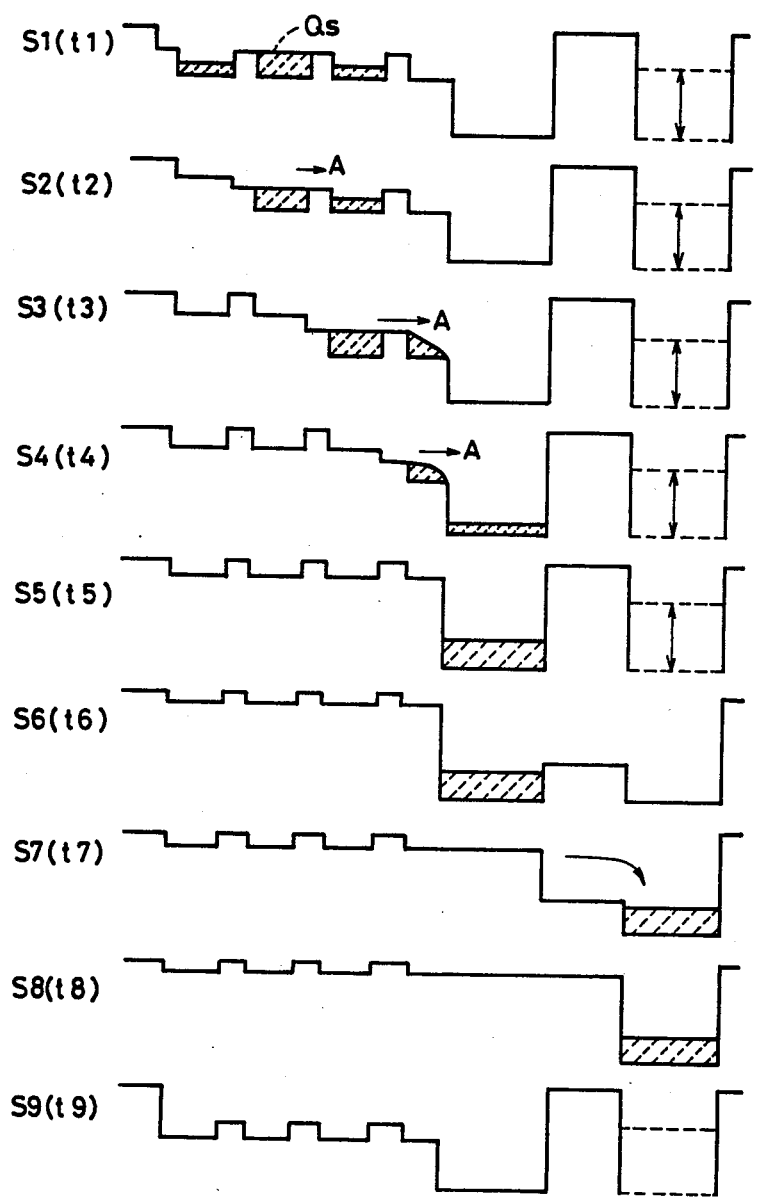
FIG. 4B shows potential states in the portions shown in FIG. 4A.

FIG. 4A is a cross-sectional view showing an embodiment of the present invention, which corresponds to a cross-sectional view of the vertical charge transferring element of a conventional solid-state image sensor. FIG. 4B shows potential states in the portions shown in FIG. 4A, in which case the timing relation of clock signals applied to gate electrodes is the same as that of the conventional solid-state image sensor shown in FIG. 3.

The structure of the embodiment of the present invention shown in FIG. 4A has the same structure of the conventional vertical charge transferring element shown in FIG. 2A, except for the following points. More particularly, small potential barrier regions 901–904 are formed in the channels provided under the gate electrodes 131–134, respectively. This has the same structure as a usual two-phase drive CCD and can be formed by means of the same process. For example, if the channels formed under the gate electrodes are of each of the potential barrier regions 901–904 can be formed by making a concentration of impurity in that region smaller than that in other portions.

Charge transferring operation of a charge transferring element of the embodiment of the present invention shown in FIG. 4B is basically the same as that of the conventional charge transferring element shown in FIG. 2B. However, in the present embodiment, if a voltage potential is applied to a gate electrode, the potential well is divided by a potential barrier, since the potential barrier is formed in the channel provided under the gate electrodes. Accordingly, the amount of the charge stored in a single potential well is restricted by a capacitance of the well. In other words, the signal charge applied to the vertical charge transferring element from a photo detector is stored in potential wells adjacent to the regions where the signal charge is applied, as shown in the state S1 in FIG. 4B. Thereafter, the signal charge is transferred, as a lump of charge, from well to well, as shown in the states S2 to S5 in FIG. 4B. For this reason, a self-induced drift caused by repulsion of carriers is increased, without spreading the charge to be transferred.

Meanwhile, the formation of potential barrier in the channel is performed by controlling the thickness of the gate oxide film.

As described in the foregoing, according to the present invention, the effect of a self-induced drift is increased and high transfer efficiency of a signal charge can be obtained, since the signal charge of charge transferring element is transferred, as a lump of charge, by way of potential wells divided by potential barriers.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A solid-state image sensor comprising:
    a plurality of photo detecting means (111 to 114, 211 to 214 and 311 to 314) two-dimensionally arranged in rows and in columns for detecting light to output signal charge ($Q_S$);
    a plurality of vertical charge transferring means (130, 230 and 330) receiving the signal charge from each of said photo detecting means, each of said vertical charge transferring means having a plurality of gate electrodes (131 to 134) each with a channel formed thereunder,
    said channel being provided with a potential barrier (901 to 904);
    horizontal charge transferring means (500) connected to said plurality of vertical charge transferring means for transferring said signal charge from said vertical charge transferring means; and
    clock means for providing clock signals to said gate electrodes so as to form a plurality of potential wells under said gate electrodes and then to remove said potential wells successively in a direction of movement of said signal charge.

2. A solid-state image sensor in accordance with claim 1, which further comprises a plurality of transfer gate means (121 to 124, 221 to 224 and 321 to 324) for controlling the transfer of the signal charge,
    said photo detecting means (111 to 114, 211 to 214 and 311 to 314) being connected to said vertical charge transferring means (130, 230 and 330) through said plurality of transfer gate means.

3. A solid-state image sensor in accordance with claim 2, wherein said transfer gate means (121 to 124, 221 to 224 and 321 to 324) comprises MOS transistors.

4. A solid-state image sensor in accordance with claim 1, which further comprises interface means (140, 240 and 340) for connecting said horizontal charge transferring means (500) to said vertical charge transferring means.

5. A solid-state image sensor in accordance with claim 1, wherein
    said channels are n-channels.

6. A solid-state image sensor in accordance with claim 1, wherein said channels are p-channels.

7. A solid-state image sensor in accordance with claim 1, wherein said channels are buried channels.

8. A solid-state image sensor in accordance with claim 1, wherein said channels are surface channels.

9. A solid-state image sensor in accordance with claim 1, wherein said potential barriers are formed by controlling impurity concentration in said channels.

10. A solid-state image sensor in accordance with claim 1, wherein said potential barriers are formed by controlling a thickness of a gate oxide film.

11. A solid state image sensor as recited in claim 1 wherein said potential wells are respectively formed under respective ones of said gate electrodes.

12. A solid-state image sensor comprising:
a plurality of photo detecting means two-dimensionally arranged in rows and in columns for detecting light to output signal charge ($Q_S$);
a plurality of vertical charge transferring means receiving the signal charge from each of said photo detecting means, each of said vertical charge transferring means having a plurality of gate electrodes each with a channel formed thereunder,
barrier means for separating adjacent channels from each other by potential barriers,
horizontal charge transferring means connected to said plurality of vertical charge transferring means for transferring said signal charge from said vertical charge transferring means; and
clock means for providing clock signals to said gate electrodes so as to form a plurality of potential wells under said gate electrodes and then to remove said potential wells successively in a direction of movement of said signal charge.

13. A solid state image sensor as recited in claim 12 wherein said barrier means comprises a variable distribution of an impurity in said channels.

14. A solid state image sensor as recited in claim 12 wherein said barrier means comprises a variable thickness of a gate oxide film.

15. A solid state image sensor as recited in claim 12 wherein said potential wells are respectively formed under respective ones of said gate electrodes.

16. In a solid state image sensor having a two-dimensional array of photo detecting means, a plurality of first charge transfer means for successively transferring charge in a first direction from groups of said photo detecting means to a second charge transfer means, said second charge transfer means operable for transferring charge received from said plurality of first charge transfer means in a second direction, and clock means providing a plurality of clock signals to a plurality of gate electrodes to form a plurality of potential wells for transferring said charge in said plurality of first charge transfer means, the improvement comprising
a plurality of barrier means, formed between channels under respective gate electrodes, for separating said channels from one another and for separating potential wells in said channels from one another thereby to enhance a self-induced drift effect and to obtain an improved efficiency of charge transfer.

* * * * *